(12) United States Patent
Roy

(10) Patent No.: US 11,776,833 B2
(45) Date of Patent: Oct. 3, 2023

(54) METHOD FOR IMPROVING ACCURACY OF IMPRINT FORCE APPLICATION IN IMPRINT LITHOGRAPHY

(71) Applicant: CANON KABUSHIKI KAISHA, Tokyo (JP)

(72) Inventor: Nilabh K. Roy, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 344 days.

(21) Appl. No.: 17/131,406

(22) Filed: Dec. 22, 2020

(65) Prior Publication Data

US 2022/0199445 A1 Jun. 23, 2022

(51) Int. Cl.
*H01L 21/68* (2006.01)
*G03F 7/00* (2006.01)
*B82Y 40/00* (2011.01)

(52) U.S. Cl.
CPC ............ *H01L 21/68* (2013.01); *G03F 7/0002* (2013.01); *B82Y 40/00* (2013.01)

(58) Field of Classification Search
CPC ........ H01L 21/68; G03F 7/0002; B82Y 40/00
See application file for complete search history.

(56) References Cited

U.S. PATENT DOCUMENTS

| | | | |
|---|---|---|---|
| 8,945,444 B2 | 2/2015 | Lu | |
| 9,090,014 B2 | 7/2015 | Lu | |
| 10,204,950 B1 | 2/2019 | Yamashita | |
| 10,209,437 B2 | 2/2019 | Zhang | |
| 10,534,259 B2 | 1/2020 | Choi | |
| 2008/0024741 A1* | 1/2008 | Butler | G03F 7/70716 355/18 |
| 2015/0123301 A1* | 5/2015 | Kasumi | G03F 7/0002 425/149 |
| 2018/0154526 A1 | 6/2018 | Oguri | |
| 2018/0194014 A1 | 7/2018 | Bibi | |
| 2019/0033709 A1* | 1/2019 | Cherala | G03F 9/7042 |
| 2019/0366620 A1* | 12/2019 | Kusaka | H01L 23/544 |
| 2020/0133120 A1 | 4/2020 | Khusnatdinov | |
| 2021/0299921 A1* | 9/2021 | Roy | G03F 7/0002 |

* cited by examiner

*Primary Examiner* — Leith S Shafi
*Assistant Examiner* — Inja Song
(74) *Attorney, Agent, or Firm* — Canon U.S.A., Inc., IP Division

(57) ABSTRACT

An imprint method is provided. The method includes exercising an imprint head along a preconditioning trajectory before contacting the imprint head with a formable material on a substrate, followed by performing imprinting on the formable material after exercising the imprint head. The exercise of the imprint head along the preconditioning trajectory may be performed after the imprint head has been idled for a predetermined period of time. The exercise of the imprint head along the preconditioning trajectory may also be performed for a duration decided based on expected throughput requirements and tools used for the imprinting process.

16 Claims, 4 Drawing Sheets

METHOD FOR IMPROVING ACCURACY OF IMPRINT FORCE APPLICATION IN IMPRINT LITHOGRAPHY

BACKGROUND

Field of Art

The present disclosure relates to nanoimprint lithography, and more particularly, to a method for improving accuracy of final imprint force application in nanoimprint lithography.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate; therefore, nano-fabrication becomes increasingly important. Nano-fabrication provides for greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into and/or onto an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, packaging, and the like.

SUMMARY

An imprint method is provided. The method includes exercising an imprint head along a preconditioning trajectory before contacting the imprint head with a formable material on a substrate, followed by performing imprinting on the formable material after exercising the imprint head. The exercise of the imprint head along the preconditioning trajectory may be performed after the imprint head has been idled for a predetermined period of time. The exercise of the imprint head along the preconditioning trajectory may also be performed for a duration decided based on expected throughput requirements and tools used for the imprinting process.

The imprint method may comprise determining the preconditioning trajectory based on a history of position trajectory of the imprint head in a previous imprinting process; an idle period after the previous imprinting process and before starting imprinting of the formable material; an expected imprinting position trajectory of the imprint head used to imprint the formable material; and an objective to be minimized. The objective may be determined based on a tool used for imprinting, process force behavior for imprinting, and force stability requirement during imprinting. The object includes minimizing a jump in average disturbance forces exerted to a first substrate and a second substrate in a run or a variation in stress relaxation disturbances over all substrates in the run.

In one embodiment, the preconditioning trajectory may be identified to be a plane which results in a reduction in a user defined metric while imprinting the formable material. The idle plane for the imprint head may be determined using a history of a position trajectory of a template of the imprint head used for imprinting the formable material, a predetermined model of disturbance forces, and an expected imprinting position trajectory of the template. The metric may include a variation in cable stress relaxation force averaged over a substrate for a plurality of substrates, a variation in cable stress relaxation force across different force calibration routines, or a variation in cable relaxation force over a first imprint field across different substrates. The final imprint force for imprinting the formable material may be estimated based on a measured overlay error and the preconditioning trajectory chosen to minimize a variation of the final imprint force over multiple substrates or to minimize a difference in final imprint forces between a first substrate and a second substrate.

A method of manufacturing an article is also provided. The imprint head is exercised along a preconditioning trajectory before contacting the template with a formable material to be applied on a substrate. The template is retained with the imprint head, and the formable material is applied to the substrate. The imprint is moved to bring the template in contact with the formable material. An imprinting process is then performed on the formable material with a real-time adjusted final imprint force.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
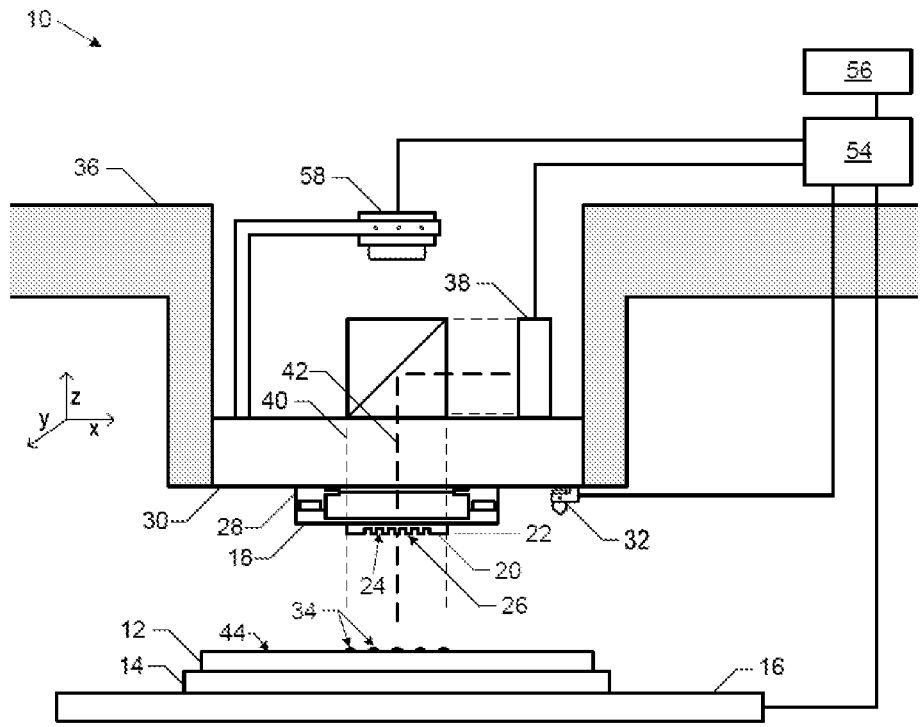
FIG. 1 is a diagram illustrating an apparatus.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Nanoimprint System

FIG. 1 illustrates a nanoimprint lithography apparatus 10 in which an embodiment may be implemented. Apparatus 10 may be used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like.

Substrate 12 and substrate chuck 14 may be further supported by positioning stage 16. Stage 16 may provide translational and/or rotational motion along one or more of the x, y, z, 0, and 4 axes. Stage 16, substrate 12, and substrate chuck 14 may also be positioned on a base (not shown).

Spaced-apart from substrate 12 is template 18. Template 18 may include a body having a first side and a second side with one side having a mesa 20 (also referred to as mold 20) extending therefrom towards substrate 12. Mesa 20 may have a patterning surface 22 thereon. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12. Alternatively, template surface 22 may be blank, i.e. without pattern features, in which case a planar surface can be formed on the substrate. In an alternative embodiment, when the patterning surface 22 is of the same areal size as the substrate, a layer can be formed over the entire substrate (e.g., whole substrate processing).

Template 18 may be coupled to template chuck 28. Template chuck 28 may be configured as, but not limited to, vacuum, pin-type, groove-type, electrostatic, electromagnetic, and/or other similar chuck types. Further, template chuck 28 may be coupled to the imprint head 30 which in turn may be moveably coupled to bridge 36 such that template chuck 28, head 30 and template 18 are moveable in at least the z-axis direction.

Apparatus 10 may further comprise a fluid dispense system 32. Fluid dispense system 32 may be used to deposit formable material 34 (e.g., polymerizable material) on substrate 12. Formable material 34 may be positioned upon substrate 12 using techniques such as drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations.

Fluid dispense system 32 may use different technologies to dispense formable material 34. When the formable material 34 is capable of jetting, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

Apparatus 10 may further comprise radiation source 38 that directs actinic energy 40 along path 42. Imprint head 30 and stage 16 may be configured to position template 18 and substrate 12 in superimposition with path 42. Camera 58 may likewise be positioned in superimposition with path 42. Apparatus 10 may be regulated by processor 54 in communication with stage 16, head 30, fluid dispense system 32, source 38, and/or camera 58 and may operate on a computer readable program stored in memory 56.

Either head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces actinic energy 40 (e.g., ultraviolet radiation) curing the formable material 34, that is, causing formable material 34 to solidify and/or cross-link conforming to a shape of substrate surface 44 of substrate 12 and patterning surface 22 of template 18, defining a formed layer on substrate 12. In an embodiment, the substrate 12, may be a substrate, an unpatterned template, or some other object on which the formable material 34 is shaped by the template 18.

Stress Relaxation Model

During the imprinting process, a contact force is exerted against the formable material on the substrate at the end of the curing process before separation of substrate and the template. A contact force is also applied against the formable material on the substrate prior to the curing while the formable material is spreading. In an embodiment, the substrate may be a semiconductor wafer, a blank template, or some other object on which the formable material 34 is shaped by the template 18. Such contact force that is applied at the end of curing is often referred to as a final imprint force (FIF). The final imprint force is one of the critical parameters that needs to be controlled with high precision for example a 0.01, 0.05, 0.1, 0.5, or 1 N (newton) precision on the tool to achieve the target overlay specification for nanoimprint lithography. Measurement of this final imprint force during the imprinting process is extremely difficult as contact-based force sensors can be intrusive to the imprinting process and may significantly affect the alignment, overlay, and other process specifications. The imprinting system is under force control during contact with the FIF, thus a direct estimation of exerted force based on estimate of current flowing through the voice coils may not capture the true force exerted on the formable material due to disturbances from for example cable stress relaxation. Currently, the final imprint force may be estimated by calibrating out the non-contact imprint force at a set position, followed by estimating the total final imprint force provided by actuators for example through the commanded currents running through the imprint head voice coils. However, it has been observed that the calibration of non-contact force is not always accurate and repeatable enough under external disturbances to hit target specifications across multiple imprint fields on multiple substrates; and thus, degrades the overlay performance. As the imprint head 30 moves from one non-contact position to another non-contact position, although the position may settle within a short period of time, the force (current) flowing through the voice coil actuator continues decaying to maintain a constant non-contact position and the decay magnitude may be larger than target specifications. The rate and magnitude of this force decay behavior can vary over time depending on the initial conditions of the system and the state of disturbance sources (such as stress in cables). It has been found that the variation can be due to the development and relaxation of stress in the cables and tubes attached to the imprint head 30 (z-head) as the imprint head 30 moves between different positions during the imprinting process. The stress relaxation behavior has been found to be motion profile dependent and can depend on many factors such as a step size between an initial position and a final position, velocity of imprint head 30 while moving from the initial position to the final position, all previous states of the cables and tubes including the initial stress in the cables and tubes. For example, as the imprint head 30 may spend time idling on a non-optimal plane i.e. on a plane where the cables and tubes connected to the imprint head 30 are not relaxed, before imprinting, stress is developed in the cables and tubing attached to a moving body of the imprint head 30.

Figure 2:
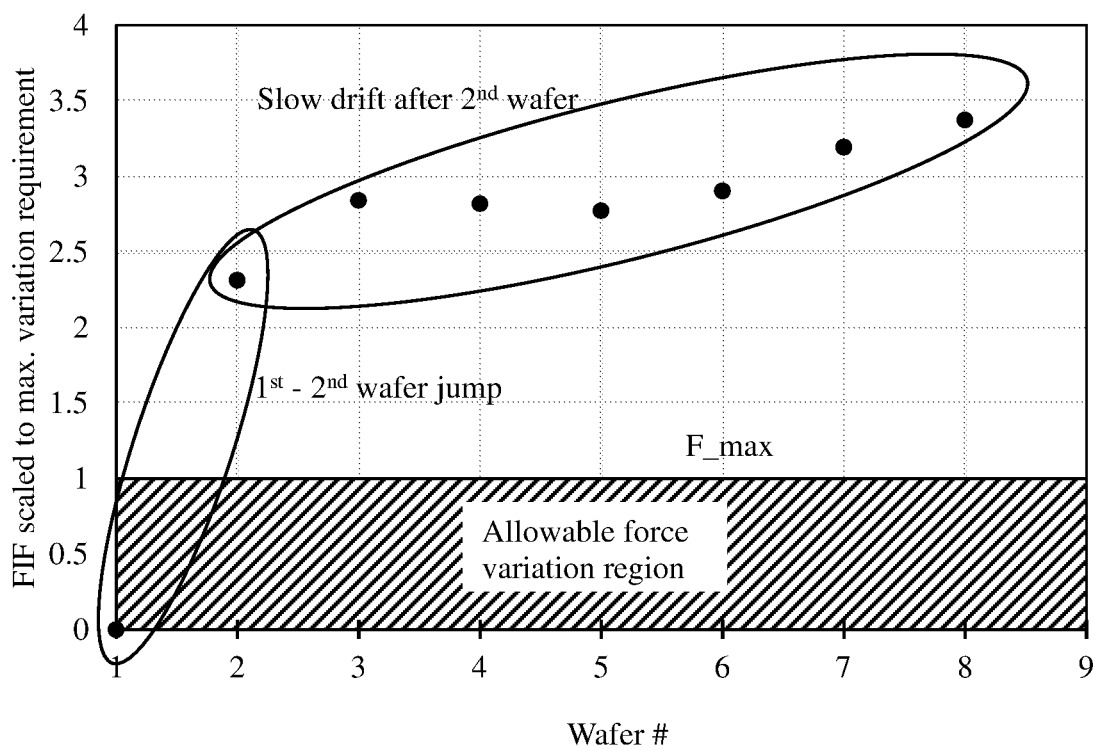
FIG. 2 shows final imprint force jump between processing a first substrate and a second substrate, and a force drift from processing the second and the following substrates.

When the imprint head 30 starts an imprinting process after an idle state, for example, a long period of no motion of the imprint head 30, as the time constants of cable stress dynamics can range from a few seconds to tens of minutes in the imprint head (depending upon the cable management quality), the stress relaxation dynamics impact the force behavior when the imprint head 30 goes through its imprinting routine over a series of substrates. This affects the stability of the final imprint force and subsequently, overlay stability over multiple substrates. The biggest effects of stress relaxation are observed in the initial time period after idling period and manifests in the form of a jump in the average final imprint force exerted by the imprint head 30 on the imprints of the second substrate in a series of substrates compared to the average final imprint force exerted on the first substrate. For example, as shown in FIG. 2, the average estimated final imprint force (extracted from overlay data after the imprint process) jumps in magnitude from processing the first substrate to processing the second substrate. From the processing of the second substrate onward, the final imprint force slowly drifts away from the imprint force applied in processing the second substrate. The average estimated final imprint force for a particular substrate may be determined by first estimating the final imprint force used to imprint each imprint field on the particular substrate based on overlay data. For each imprint field on the particular substrate overlay data is measured at a plurality of locations in the imprint field after imprinting. This overlay data is then fit to a process variation model. The process variation model may be based on one or more of experimental methods and simulation methods, such as finite element analysis, finite difference analysis, finite volume analysis, and other computational methods which describe how variation in the set of shaping conditions results in variation in quality of the imprinted film. US patent publication No. 2019/0033709-A1, which is hereby incorporated by reference, describes how this variation in the set of shaping conditions can results in variation in the quality of the imprinted film and how this variation can be simulated. The set of shaping conditions which can be simulated by the process variation model includes the final imprint force used at the end or during a curing period along with other shaping conditions. A first set of these other shaping conditions may be controlled with the positioning systems such as: shift(s) along one or more perpendicular axes; rotation along one or more axes; tilt along one or more axes; and rotation along one or more axes. A second set of these shaping conditions may be associated with the thermal radiation source and/or the finger subassembly such as: magnification along one or more axes; trapezoidal distortion along one or more axes; and skew along one or more axes.

The underlying physics of stress relaxation in the cables or tubing can be used to establish a dynamic model of the stress relaxation in cables or tubing to estimate force disturbance at any time instant based on prior motion history of the imprint head. The dynamic model can be expressed in the form of:

$$\dot{x}(t) = Ax(t) + Bu(t)$$

$$f_d(t) = C\,x(t) + Du(t) \text{ or}$$

$$f_d(t) = g(x(t), \dot{x}c(t), u(t), t)$$

where x(t) are the M state variables of the model, u(t) is the imprint head position at a time instant (t), $\dot{x}$(t) is the time derivative of the state variable x(t), and $f_d$(t) is the instantaneous force disturbance due to for example stress relaxation of the cables. This model is typically obtained, that is, the model parameters A (M×M matrix), B (M×1 matrix), C (1×M matrix), and D (1×1 matrix) are typically estimated, using the position u(t) and force (a function of the commanded forces supplied by actuators) traces of the imprint head 30 during a previous calibration routine or imprinting. To obtain an estimate of the disturbance forces, $f_d$(t), static force contributions from known stiffness elements in the imprint head positioning system such as flexures and springs, is calibrated out from the total force traces which are estimated from the commanded current supplied to the actuators. Finding the model parameters may include fitting the dynamic model above to the force disturbance estimate, $f_d$(t) trace from the test. Once the model parameters i.e. matrices A, B, C, and D for a linear model or a non-linear function, g are identified and the model is found to be adequate and robust, the model can be used to predict the force disturbance due to for example stress relaxation of the cables as the imprint head 30 goes through its motions before, during, and after the imprint process, even in force control when direct observability to this force disturbance using the existing scheme is nonexistent. During the imprinting process one or more encoders may be used to indicate the position of the imprint head 30. Position based feedback control of the actuators may be used to control the motion of the imprint head 30 during a part of the imprinting process. During curing, the force that the patterning surface 22 applies to the formable material 34 may also be controlled by adjusting force supplied by the actuators using force based feedback control. In order to have accurate control of the final imprint force exerted by the patterning surface against the formable material, the force supplied by the actuators should take the predicted disturbance forces $f_d(t)$ into account.

Optimal Trajectory/Path Generation

Figure 3:
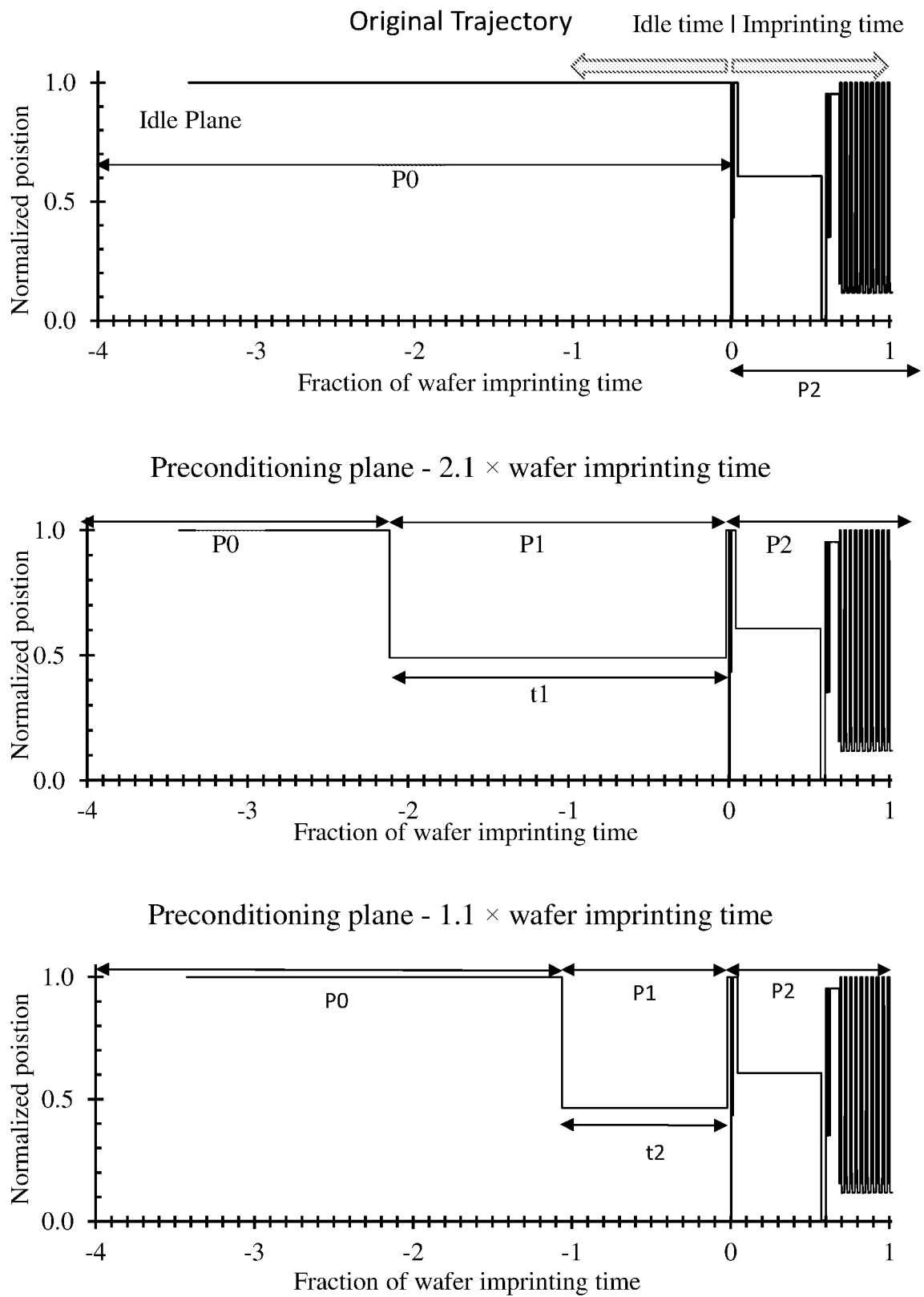
FIG. 3 illustrates the position traces of an imprint head at various time horizons for two different preconditioning plane solutions for different time horizons, t1 and t2 and a comparison with the original position of the imprint head with no preconditioning.

To bring the imprint head to a more repeatable and stable force behavior from an idle state, preconditioning of the imprint head 30 may be used before starting actual imprinting. An idle state is defined as a period of time during which the imprint head 30 is resting/idling at a pre-determined position along the z-motion axis and is not performing any actions related to actual imprinting or in preparation for the subsequent imprinting (such as metrology tasks before imprinting on a substrate). The idle time may be a period of time that is greater than the period of time required to imprint a single substrate. A preconditioning trajectory may be used before imprinting the first substrate in a series of substrates or may be used before each substrate in a series of substrates if the throughput requirements are low and the throughput requirements can be met with having a preconditioning trajectory before imprinting on each substrate. As an example, if the time gap between imprinting two consecutive substrates is more than 2-3 minutes, a preconditioning trajectory may be determined and added to the routine individually before imprinting each such substrate subject to meeting the desired throughput constraints of the process. In another case, if the time gap between two consecutive substrates is small, say less than 1-2 minutes, it may not be efficient to use preconditioning before imprinting each substrate. "Preconditioning" means exercising the imprint head through a trajectory that brings the imprint head to a more stable and repeatable behavior before starting the imprinting process. As shown in FIG. 3, the time horizon p0 is defined as the time duration over which the imprint head 30 idles at a predetermined plane and may also include portions of a previous imprinting routine. The past history or trajectory of the imprint head 30 in p0 is expected to be available or the model obtained above has been running during p0 keeping a track of the states, x(t) and force disturbance, $f_d(t)$. It is also desired that the length of time horizon, p0 be at least as long as the longest time constant determined for the cable stress relaxation model i.e., knowledge of the imprint head 30 motion history for at least as long as the longest time constant in the model is desired. The time horizon p1 is referred to as an optimization time horizon or time length of preconditioning routine, which can be modulated depending on the process requirements such as throughput requirements of the process and can vary from process to process. The time horizon p2 refers to the actual imprinting routine over a substrate or a series of substrates one after the other. The imprinting process may include identifying an optimal preconditioning trajectory of the imprint head 30. The optimal preconditioning trajectory is performed in the time horizon p1 to minimize an objective function, using the knowledge of imprint head's past trajectory i.e., trajectory during p0 and an expected estimate of the trajectory during actual imprinting i.e., during p2 and a predetermined model of disturbance forces such as cable stress dynamics. The objective functions for the optimization may be different objectives depending upon the tool and process force behavior and force stability requirements during imprinting i.e., during time horizon, p2. For example, the objective functions may include minimizing the jump in average force disturbance over the substrate between the first substrate and the second substrate $|f_{Wafer1} - f_{Wafer2}|$. The average force disturbance $f_{Waferi}$ for substrate i may be calculated by averaging the predicted force disturbance over P imprint fields at a final imprint force time at the end of the curing period $t_{j,FIF}$ for each imprint field j as described by equation below. In an alternative embodiment, $f_d(t_{j,FIF})$ is the average predicted force disturbance during the curing period.

$$f_{Waferi} = \frac{1}{P} \sum_{j}^{P} f_d(t_{j,FIF})$$

Another example of the objective function is to minimize the standard deviation, σ of average force disturbance variation at imprints over all subsequent substrates, that is, to minimize σ of average force $f_{Waferi}$ over Q substrates as described in the equation below.

$$\sigma = \sqrt{\frac{1}{Q} \sum_{i=1}^{Q} \left( f_{Waferi} - \frac{1}{Q} \sum_{i=1}^{Q} f_{Waferi} \right)^2}$$

Alternatively, a custom objective function such as weighted sum $(w_1|f_{Wafer1} - f_{Wafer2}|w_2\sigma)$ or $(w_1(f_{Wafer1} - f_{Wafer2})^2 + w_2\sigma^2)$ may be defined as to stabilize specific force behavior of the imprint head 30. Another metric could be to minimize the variation in cable stress relaxation force across force calibration routines which may be carried out once before imprinting every substrate. It is to be noted that, depending upon the definition of the objective function, an expected nominal position profile of the imprint head during imprinting, that is, position profile in p2, may be required for the optimization prior to actual imprinting.

Figure 5:
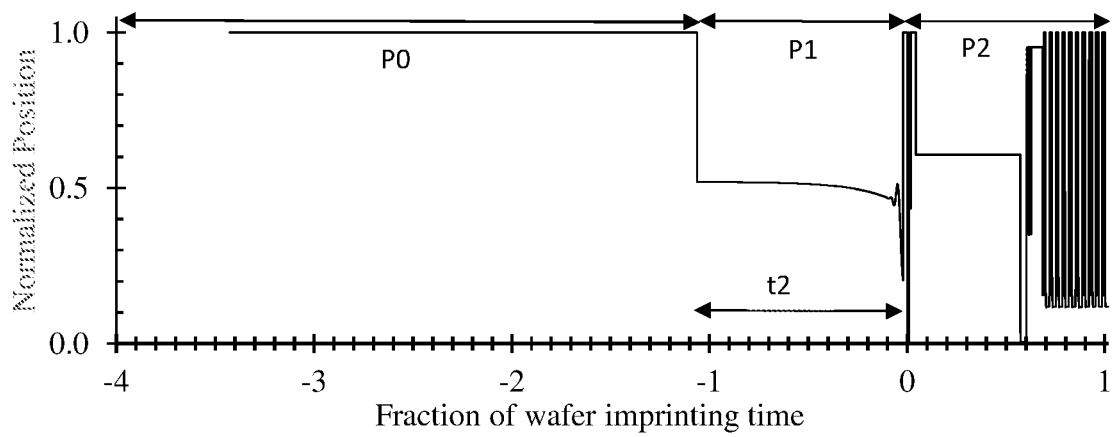
FIG. 5 illustrates the position traces of an imprint head with a preconditioning trajectory.

The imprint head motion trajectory u(t) in time horizon p1 is to be found with the minimized objective function, for example, minimized $|f_{Wafer1} - f_{Wafer2}|$, that is, the minimized force disturbance jump between the first and second substrates, with the constraints as:

$$\dot{x}(t) = Ax(t) + Bu(t) \qquad (1)$$

$$f_d(t) = Cx(t) + Du(t), \qquad (2), \text{ or}$$

$$f_d(t) = g(x(t), \dot{x}(t), u(t), t) \qquad (3), \text{ with}$$

$$u(t) = [-800 \text{ μm}, 300 \text{ μm}]$$

where x(t) is the M state variables for this model, u(t) is the imprint head position at a time instant, and $f_d$ is the force disturbance due to stress relaxation of the cables. The minimum and maximum motion limits of the imprint head may be limited between −800 μm and 300 μm depending upon the imprint head design such as motion range specification of the imprint head, space, and safety constraints. These motion limits are exemplary and can vary from one imprint head to another imprint head depending upon where the zero of the imprint head motion is set at/defined while the motion range is determined to be within the motion range specification of the hardware. Various numerical techniques, optimization algorithms, solvers are available for solving the above optimization problems, for example, Pontryagin's maximum principle, Constrained Optimization using various tools for example—FMINCON (MATLAB function), constrained linear optimization, IPOPT (Python library), NLOPT (Open source library for non-linear optimization), Genetic Algorithm, and Pattern search. Once the problem has been adequately set up and the constraints have been defined, an optimal solution can be obtained that minimizes the objectives while meeting the constraints. FIG. 5 shows an example problem using an actual imprint run's position trace set up in MATLAB and using FMINCON for identifying the optimal solution over a time horizon P1 to minimize the variation in force disturbance over the next 10 substrates. A preconditioning trajectory is found over the preconditioning time period, t2 that minimizes the objective. This preconditioning trajectory or solution may be used in time horizon, p1 before starting an imprinting routine over a substrate or a series of substrates.

In an embodiment, the optimization problem can be modified to identify a preconditioning plane solution, u0 instead of a time-varying trajectory, u(t) in time horizon, p1. A preconditioning plane solution may be more desirable compared to a time-varying trajectory solution in terms of smaller velocity changes, acceleration changes, jerk changes to the imprint head motion and can be easier to execute with the hardware and software (computationally fewer parameters to identify—1 position identification for a plane vs. 1000s of intermediate position point identifications for a time varying trajectory) compared to a more complex time varying trajectory. As an example, the preconditioning trajectory includes holding the imprint head 30 at a preconditioning plane position for a time horizon p1 which also minimizes the average force disturbance variation from $1^{st}$ substrate to $2^{nd}$ substrate and thus, improving the performance of the imprinting process. Different planes are found for different preconditioning time horizons p1 and are listed in the Table I (row 3 to 7). For example, as shown in FIG. 3, the imprint head is placed at plane 1 and plane 2 during two different time horizons, t1 and t2, respectively. The objective function value which is to minimize the average force disturbance variation from $1^{st}$ substrate to $2^{nd}$ substrate and 3σ force resulted from the sample trajectories are listed in Table I. For reference, the performance of a cycling trajectory where the imprint head 30, cycles for a period of time is included in row 2 of Table 1 relative to no preconditioning (row 1 of table 1) and to preconditioning optimization solutions. As can be observed from the table, all preconditioning solutions minimize the objective (force disturbance variation from $1^{st}$ substrate to $2^{nd}$ substrate) better than a typical cycling solution for preconditioning. This preconditioning optimization also provides an interesting solution where it is found that if the imprint head is idled at (−212) um plane for the whole idling duration, the objective function would be minimized. As shown in the table, if the imprint head is placed at a plane different from the plane z=0 for the whole idle duration, the plane at z=−212.1 µm provides the best force stability—both in terms of force disturbance variation from $1^{st}$ substrate to $2^{nd}$ substrate and overall variation in force disturbance over imprinting of next 10 substrates. This indicates that the idling plane position for the imprint head should be set closer to (−212) um plane as the cables are least stressed when resting at that plane.

TABLE I

| Preconditioning Routine | p1 (seconds) | Optimal Plane (µm) | Objection Function (1st-2nd wafer jump (N) | 3σ (N) |
| --- | --- | --- | --- | --- |
| No preconditioning | 1800 | 27 | 0.218 | 0.281 |
| Cycling | 377.5 | NA | 0.029 | 0.101 |
| Plane | 377.5 | −267 | 0 | 0.086 |
| Plane | 187.5 | −282.6 | 0 | 0.096 |
| Plane | 23 | −456.7 | 0 | 0.107 |
| Plane | 15 | −590.1 | 0 | 0.108 |
| Plane | 1800 | −212.1 | 0 | 0.046 |

Figure 4A:
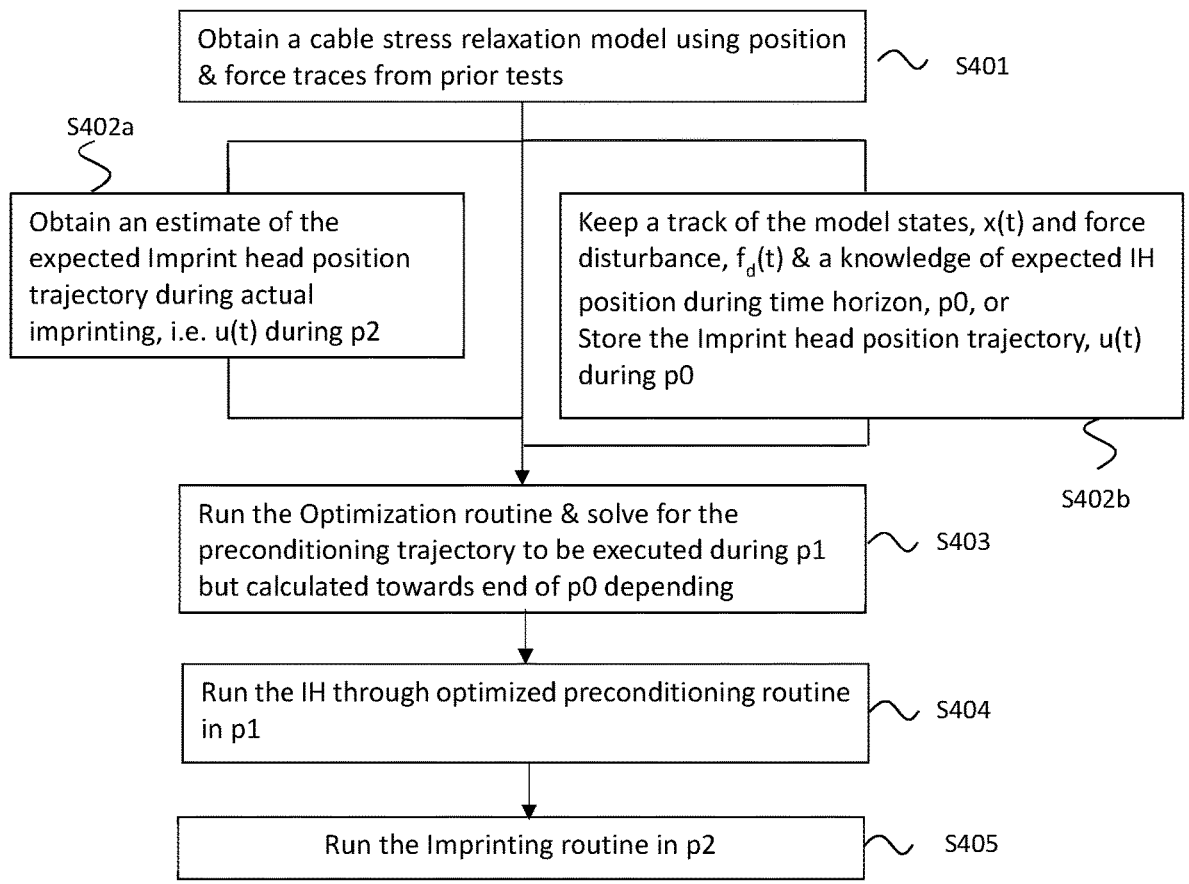
FIGS. 4A and 4B show the method for obtaining the optimal trajectory for an imprint head (a tool and process)
Figure 4B:
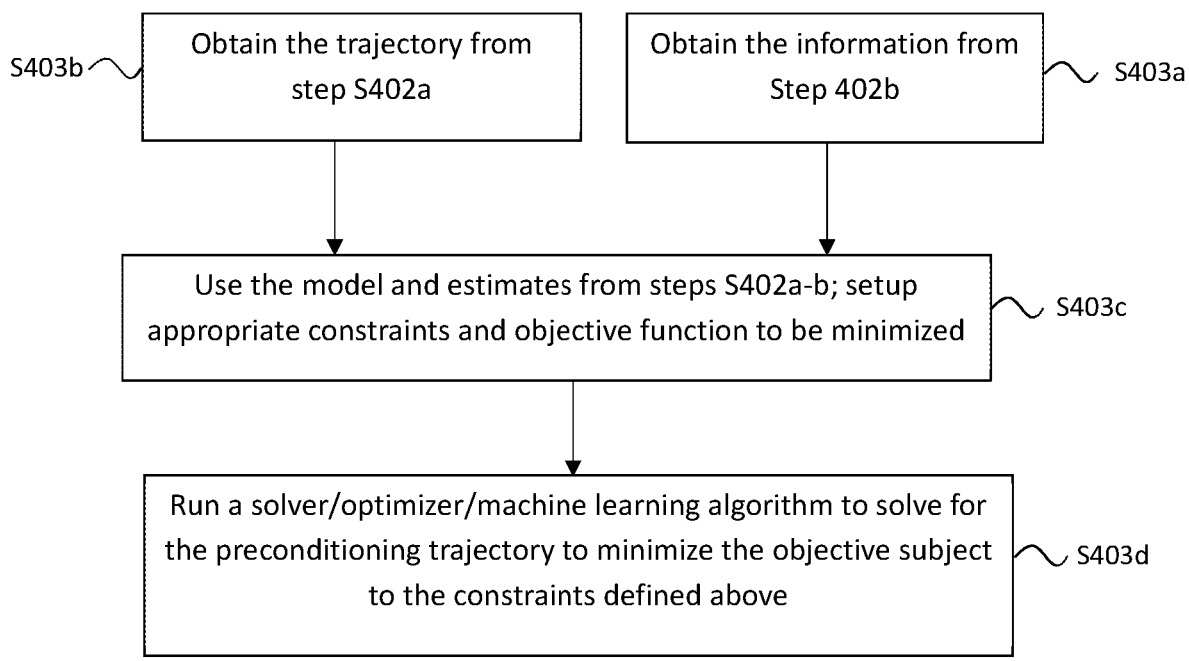

FIG. 4A illustrates the process flow of a method for obtaining the optimal trajectory for an imprint head (a tool and process) in real-time. In step S401, the dynamic model for cable stress relaxation or other disturbance in the imprint head is obtained using prior motion and force disturbance history. The dynamic model may be of the form given by Equation (1) and (2) or Equation (3) discussed above. In step S402a, the expected position trajectory of the imprint head 30 for imprinting over a number of substrates is obtained based on historical data, spread time, and other process variables. In other words, the expected imprint head motion trajectory u(t) in time horizon p2 is estimated from the historical data, spread time, and other imprint process timing details such as any metrology steps before imprinting on a substrate or metrology between consecutive imprints. In step S402b, either the position history of the imprint head during time horizon, p0 should be available or assuming the dynamic model for cable stress relaxation is running on the tool in real-time and hence, it has a knowledge of the imprint head 30 past motion trajectory i.e., u(t) during p0 and has a knowledge of the state of the cable stress relaxation dynamics, x(t) and magnitude of force disturbance, $f_d(t)$ at any instant of time. As stated earlier, it is desired that the model must have been running on the tool for at least as long as the longest time constant or must have a knowledge of the imprint head motion trajectory, u(t) for that time duration during p0. The time horizon for preconditioning i.e., duration of p1, before the first substrate in a series of substrates is decided considering the expected throughput requirements of the process and may vary from process to process and tool to tool. In step S403 as illustrated through FIG. 4B, the objective function to be minimized is defined in step S403c, optimization constraints (based on tool hardware design, trajectories that can be executed, computational and time complexity etc.) are provided in step S403b, and the information from Steps S402a and S402b is fed to the model and the optimizer/solver is run to get an optimal trajectory in step S403d, u(t) for preconditioning during the time horizon p1 for a given expected imprint routine during the time horizon p2 (obtained during step S403a). For the real time application, this optimization is expected to be complete & an optimized preconditioning trajectory solution be available before the start of the preconditioning horizon, p1. Thus, step 403b which requires imprint head position during p0, may include a combination of the imprint head position history (for the time that has elapsed during p0 when optimization routine starts) and an expected position trajectory of the imprint head for the remaining time in p0 (imprint head position trajectories are known with good accuracy & reliability in advance). In step S404, the imprint head is exercised along the trajectory during preconditioning time horizon p1, followed by the imprint run during the time horizon p2 in step S405.

In an embodiment, the preconditioning trajectory is only performed before the start of imprinting on a first substrate in a series of substrates. In an alternative embodiment, the preconditioning trajectory is performed before every substrate in a series of substrates. In an embodiment, the preconditioning trajectory is generated prior to the loading of the imprinting parameters of the imprinting process. In an embodiment, the preconditioning trajectory is generated during the imprinting process. In an embodiment, the preconditioning trajectory is adjusted during the imprinting process.

The optimization method described above may be used not only for determining the preconditioning routines, but also for optimizing the imprint motion itself that reduces or minimizes a user defined metric/objective such as the variation in force disturbance over time. This variation may be due to cable stress relaxation. The optimization method may lead to a more stable force behavior. The optimization routine can also be used for other dynamic disturbances that affect stability on another sub-system to provide optimal trajectories or path for preconditioning the system. The metric may include the variation in average force disturbance exerted by the template against the formable material on the substrate over a plurality of substrates that have been imprinted with the formable material.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprint method, comprising:
   exercising an imprint head along a preconditioning trajectory before contacting the imprint head with a formable material on a substrate; and
   performing imprinting on the formable material after exercising the imprint head along the preconditioning trajectory,
   wherein the preconditioning trajectory is identified to be a plane which results in a reduction in a user defined metric while imprinting the formable material,
   wherein the metric includes:
      a variation in cable stress relaxation force averaged over a substrate for a plurality of substrates;
      a variation in cable stress relaxation force across different force calibration routines; or
      a variation in cable stress relaxation force over a first imprint field across different substrates.

2. The imprint method according to claim 1, wherein exercising the imprint head along the preconditioning trajectory is performed after the imprint head has been idled for a predetermined period of time.

3. The imprint method according to claim 1, further comprising exercising the imprint head along the preconditioning trajectory for a duration decided based on expected throughput requirements and tools used for the imprinting process.

4. The imprint method according to claim 1, further comprising determining the preconditioning trajectory based on:
   a history of position trajectory of the imprint head in a previous imprinting process;
   an idle period after the previous imprinting process and before starting imprinting of the formable material;
   an expected imprinting position trajectory of the imprint head used to imprint the formable material; and
   an objective to be minimized.

5. The imprint method according to claim 4, wherein the objective is determined based on a tool used for imprinting, process force behavior for imprinting, and force stability requirement during imprinting.

6. The imprint method according to claim 4, wherein the objective includes minimizing a jump in average force disturbance exerted to a first substrate and a second substrate in a run or a variation in disturbances from cable stress relaxation over all substrates in the run.

7. The imprint method according to claim 1, further comprising determining an idle plane for the imprint head using:
   a history of a position trajectory of a template of the imprint head used for imprinting the formable material;
   a predetermined model of disturbance forces; and
   an expected imprinting position trajectory of the template.

8. The imprint method of claim 1, wherein a final imprint force for imprinting the formable material is estimated based on a measured overlay error and the preconditioning trajectory chosen to minimize a variation of the final imprint force over multiple substrates or to minimize a difference in final imprint forces between a first substrate and a second substrate.

9. A method of manufacturing an article, comprising:
   exercising an imprint head along a preconditioning trajectory before contacting a template with formable material to be applied on a substrate;
   applying formable material on the substrate;
   retaining the template with the imprint head;
   moving the imprint head to bring the template in contact with the formable material; and
   imprinting the formable material with a real-time adjusted final imprint force,
   wherein the preconditioning trajectory is identified to be a plane which results in a reduction in a user defined metric while imprinting the formable material,
   wherein the metric includes:
      a variation in cable stress relaxation force averaged over a substrate for a plurality of substrates;
      a variation in cable stress relaxation force across different force calibration routines; or
      a variation in cable stress relaxation force over a first imprint field across different substrates.

10. The method according to claim 9, wherein exercising the imprint head along the preconditioning trajectory is performed after the imprint head has been idled for a predetermined period of time.

11. The method according to claim 9, further comprising exercising the imprint head along the preconditioning trajectory for a duration decided based on expected throughput requirements and tools used for the imprinting process.

12. The method according to claim 9, further comprising determining the preconditioning trajectory based on:
   a history of position trajectory of the imprint head in a previous imprinting process;
   an idle period after the previous imprinting process and before starting imprinting of the formable material;
   an expected imprinting position trajectory of the imprint head used to imprint the formable material; and
   an objective to be minimized.

13. The method according to claim 12, wherein the objective is determined based on a tool used for imprinting, process force behavior for imprinting, and force stability requirement during imprinting.

14. The method according to claim 12, wherein the object includes minimizing a jump in average force disturbance exerted to a first substrate and a second substrate in a run or a variation in disturbances from cable stress relaxation over all substrates in the run.

15. The method according to claim 9, further comprising determining an idle plane using:
- a history of a position trajectory of a template of the imprint head used for imprinting the formable material;
- a predetermined model of disturbance forces; and
- an expected imprinting position trajectory of the template.

16. A method of manufacturing an article, comprising:
- exercising an imprint head along a preconditioning trajectory before contacting a template with formable material to be applied on a substrate;
- applying formable material on the substrate;
- retaining the template with the imprint head;
- moving the imprint head to bring the template in contact with the formable material; and
- imprinting the formable material with a real-time adjusted final imprint force,
- wherein a final imprint force for imprinting the formable material is estimated based on a measured overlay error and the preconditioning trajectory chosen to minimize a variation of the final imprint force over multiple substrates or to minimize a difference in final imprint forces between a first substrate and a second substrate.

* * * * *